US008879323B2

(12) United States Patent
Wang (10) Patent No.: US 8,879,323 B2
(45) Date of Patent: Nov. 4, 2014

(54) INTERCONNECTION MATRIX USING SEMICONDUCTOR NON-VOLATILE MEMORY

(71) Applicant: FlashSilicon Incorporation, Diamond Bar, CA (US)

(72) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 220 days.

(21) Appl. No.: 13/683,721

(22) Filed: Nov. 21, 2012

(65) Prior Publication Data
US 2014/0140139 A1 May 22, 2014

(51) Int. Cl.
*G11C 16/04* (2006.01)

(52) U.S. Cl.
USPC ............ 365/185.18; 365/185.14; 365/185.26; 365/185.29

(58) Field of Classification Search
USPC .............. 365/185.18, 185.14, 185.26, 185.29
See application file for complete search history.

(56) References Cited

U.S. PATENT DOCUMENTS

| | | | |
|---|---|---|---|
| 5,301,150 A | 4/1994 | Sullivan et al. | |
| 5,504,706 A | 4/1996 | D'Arrigo et al. | |
| 5,596,526 A * | 1/1997 | Assar et al. | 365/185.17 |
| 6,191,980 B1 | 2/2001 | Kelley et al. | |
| 6,329,240 B1 | 12/2001 | Hsu et al. | |
| 6,696,724 B2 | 2/2004 | Verhaar | |
| 7,019,353 B2 | 3/2006 | Lindsay et al. | |
| 7,616,501 B2 * | 11/2009 | Sporea et al. | 365/185.24 |
| 7,729,165 B2 * | 6/2010 | Wang | 365/185.03 |
| 7,733,700 B2 | 6/2010 | Wang | |
| 7,800,156 B2 | 9/2010 | Roizin et al. | |
| 7,825,479 B2 | 11/2010 | Booth et al. | |
| 8,199,590 B1 * | 6/2012 | Novosel et al. | 365/189.2 |
| 8,363,491 B2 * | 1/2013 | Mu et al. | 365/189.16 |
| 2011/0157974 A1 | 6/2011 | Lee et al. | |
| 2012/0299079 A1 | 11/2012 | Wang | |

OTHER PUBLICATIONS

Ohsaki, et al., "A Single Poly EEPROM Cell Structure for Use in Standard CMOS Processes", IEEE Journal of Solid-State Circuits, vol. 29, No. 3, Mar. 1994 pp. 311-316.

* cited by examiner

*Primary Examiner* — Pho M Luu
(74) *Attorney, Agent, or Firm* — Muncy, Geissler, Olds & Lowe, P.C.

(57) ABSTRACT

An interconnection matrix consists of a plurality of semiconductor Non-Volatile Memory (NVM) forming an M×N array. Semiconductor NVM devices in the array are either programmed to a high threshold voltage state or erased to a low threshold voltage state according to a specific interconnection configuration. Applied with a gate voltage bias higher than the low threshold voltage and lower than the high threshold voltage to the control gates of the entire semiconductor NVM devices in the array, the configured interconnection network is formed. The disclosed interconnection matrix can be applied to configuring circuit routing in Integrated Circuit (IC).

23 Claims, 6 Drawing Sheets

INTERCONNECTION MATRIX USING SEMICONDUCTOR NON-VOLATILE MEMORY

BACKGROUND OF THE INVENTION

1. Field of the Invention

This invention relates to interconnection matrixes for circuit routing in Integrated Circuit (IC). In particular, an array of semiconductor NVM devices is applied to form an interconnection matrix. Applied with a control gate voltage bias lower than the high threshold voltage and higher than the low threshold voltage, the NVM devices with programmed high threshold voltages are "off" to disconnect the two input-output terminals. While the un-programmed NVM devices with low threshold voltages having the same applied control gate bias are "on" to connect the two input-output terminals.

2. Description of the Related Art

In field of Integrated Circuit (IC), active elements like transistors and passive elements like resistors and capacitors are connected by metal wires and inter-layered metal vias/contacts. The metal connection is usually done by the final metallization process in semiconductor manufacturing. Once the final hard wiring process is completed the circuitry is not able to change without re-masking and re-processing on the new silicon. Lack of flexibility of changing the wiring configuration after fabrication the hard wiring methodology usually results in the development cost increase for mask revision and silicon re-fabrication, and further prolongs the development time.

In most IC chips, minor wiring changes after manufacturing process are necessarily required for trimming the electrical parameters of passive elements, memory redundancy for yield improvement, and chip identifications. For such applications, electrical fuses and anti-fuses are usually used for those purposes. Once programmed, the electrical fuses (anti-fuses) cannot convert back to their original state, that is, the programmed states of fuses (anti-fuses) are not reversible. For the reason, the electrical fuses (anti-fuses) are One-Time-Programmable (OTP) non-volatile memory elements.

On the other hand, OTP types of fuses (anti-fuses) are not able to provide viable solutions for the applications requiring large configurable wiring capacity such as Field Programmable Array (FPA) and multiple configurable I/Os (input/output pads). Using large amounts of OTP fuses (anti-fuses) for the multiple times configurable wiring capacity in IC chips become unrealistic costly. Since the semiconductor non-volatile memory devices are usually required to provide at least ten thousand times of programming-erase cycling the choice of non-volatile memories with Multiple Times Programmable (MTP) capability would be the most cost effective solution for multiple times wiring configurations in IC chips.

Semiconductor non-volatile memory is a type of Metal-Oxide-Semiconductor Field-Effect Transistor (MOSFET) capable of storing charges to alter the threshold voltages of the MOSFET. For example, electrons stored in the storing material of the semiconductor non-volatile memory cause the threshold voltage of the MOSFET shifted to a higher threshold voltage. The threshold voltage of the semiconductor non-volatile memory is shifted down to a lower threshold voltage after removing the stored electrons from the storing material or injection of holes to neutralize the stored electrons. The programming process is to raise the threshold voltage of a semiconductor non-volatile memory to a higher threshold voltage state while the erase process is to lower a programmed non-volatile memory from a high threshold voltage state to a low threshold voltage state. The programming/erase methods such as Hot Carrier Injection (HCI), Fowler-Nordheim (FN) tunneling, and Band-to-Band (BTB) tunneling for semiconductor non-volatile memory are well-known in the field. Since the stored charges in the storing material of a semiconductor non-volatile memory can be held for a long period of time for at least ten years under normal operational condition the threshold voltage of the non-volatile MOSFET remains insignificant changes during the course of operations. The "on"/"off" characteristics of semiconductor non-volatile memory will retain through the operational life for at least ten years.

Another aspect of applying semiconductor non-volatile memory for interconnection matrix in IC chip is that the core operational voltages in modern IC chips have been reduced to 1 volt more or less. The core operational voltage can be easily passed by semiconductor non-volatile memory devices without applying too high voltages to their control gates. Furthermore, the low core operational voltages of the modern IC chips are coincident with the required low voltages for applying to the drain electrodes of non-volatile memory devices without disturbing the devices' threshold voltages from the drain hot carrier injection, a phenomenon known as the read disturbance from applying high drain voltages.

In another aspect of applying semiconductor non-volatile memory for interconnection matrix in IC chips, a Scalable Gate Logic Non-Volatile Memory (SGLNVM) using standard CMOS process has been successfully developed (U.S. patent application Ser. Nos. 13/399,753 and 13/454,871, the disclosures of which are incorporated herein by reference in their entirety). SGLNVM is easily incorporated in the standard CMOS IC manufacturing with no added process cost. Owing to the non-volatile "on"/"off" and MTP properties of SGLNVM, the SGLNVM interconnection matrix can provide a very convenient and cost effective mean for configuring circuit routings in IC chips.

SUMMARY OF THE INVENTION

Figure 1:
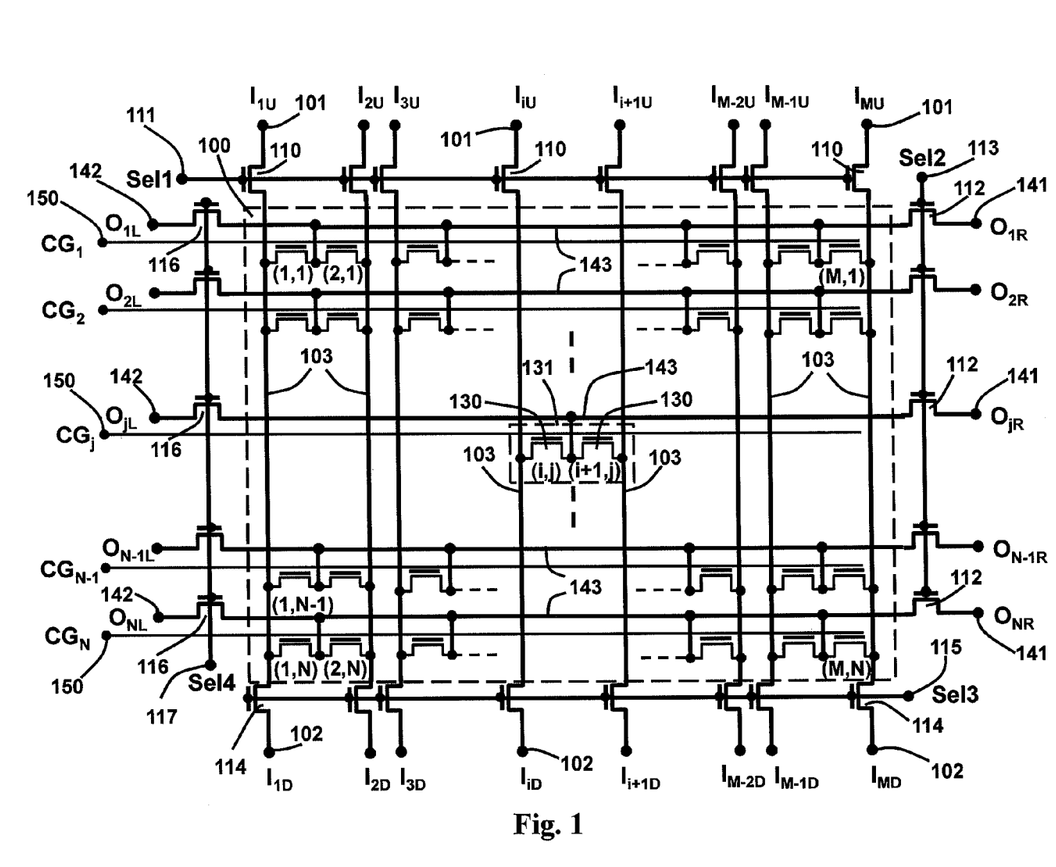
FIG. 1 shows the schematic of the interconnection matrix using N-type non-volatile memory devices according to one embodiment of the invention.

The schematic of 2M-inputs and 2N-outputs interconnection matrix consisting of an M×N NVM array 100 and selection MOSFET switches (110, 112, 114, and 116) are shown in FIG. 1. In the M×N NVM array 100 in the NOR configuration, where the NVM cells 130 are paired with one shared common source electrode and two separate drain electrodes as illustrated in unit 131 in the middle of FIG. 1, a row of control gates 150 of NVM cells 130 forms the control gate line CGj for j=1 ... N; a column of drain electrodes of NVM cells 130 are connected to form the i-bitline 103 for i=1 ... M; a row of common source electrodes of NVM cells 130 are connected to form the j-common source line 143 for j=1 ... N. The input terminals 101 and 102, denoted by $I_{iU}$ and $I_{iD}$ for i=1 ... M, are connected to M bitlines 103 in the M×N NOR NVM array through MOSFET switches 110 and 114, respectively. The output terminals 141 and 142, denoted by $O_{jR}$ and $O_{jL}$ for j=1 ... N, are connected to N common source lines 143 in the M×N NOR NVM array through MOSFET switches 112 and 116, respectively.

In configuring the interconnection matrix, the NVM cells 130 in the M×N NOR array 100 are initially erased to the low threshold voltage state $V_{thL}$ using either Fowler-Nordheim tunneling or Band-to-Band tunneling, which are known to those of ordinary skill in the art. We will not address in details. The NVM cells 130 in the array are at the low threshold voltage state $V_{thL}$ after erase operation. Upon applying a control gate voltage greater than their low threshold voltages the entire interconnected nodes of the interconnection matrix are connected altogether. To disconnect between two nodes, the specific NVM with source/drain electrodes attached between two nodes is programmed to a high threshold voltage state $V_{thH}$ by a programming scheme disclosed in U.S. Pat. No. 7,733,700 (the disclosure of which is incorporated herein by reference in its entirety). For example, as shown in FIG. 1, every NVM cell (i, j) in the M×N array 100 is programmed to the high threshold voltage state $V_{thH}$ to disconnect bit line i from common source line j for 1<i<M and 1<j<N. The programming operation of NVM cells in the interconnection matrix of the invention is similar to the fuse-blown operation in a conventional interconnection matrix having fuse-type elements.

After configuring the interconnection matrix, when the interconnection matrix is required to pass the supply core voltage signal $V_{DD}$, usually representing a digital signal "1", the control gate lines CGj for j=1 . . . N, of the entire array are biased with a voltage $V_a$ for $(V_{thL}+V_{DD})<V_a<V_{thH}$. By applying a voltage signal, $V_{sel}>(V_{DD}+V_{th})$, to the gate terminals (111, 113, 115, and 117) of the selection switches (110, 112, 114, and 116) in FIG. 1, where $V_{th}$ is the selection switch threshold voltage, a network of interconnection matrix able to pass signals less than $V_{DD}$ is formed. To disconnect the interconnection matrix from the external data bus lines, the voltage signals at the gate terminals (111, 113, 115, and 117) of the selection switches (110, 112, 114, and 116) are set to ground. Alternatively to detach a row of NVM cells from a specific output line $O_j$ in the interconnection matrix in FIG. 1, a voltage less than $V_{thL}$, usually the ground voltage, can be applied to the control gates of the row of NVM cells.

Figure 2:
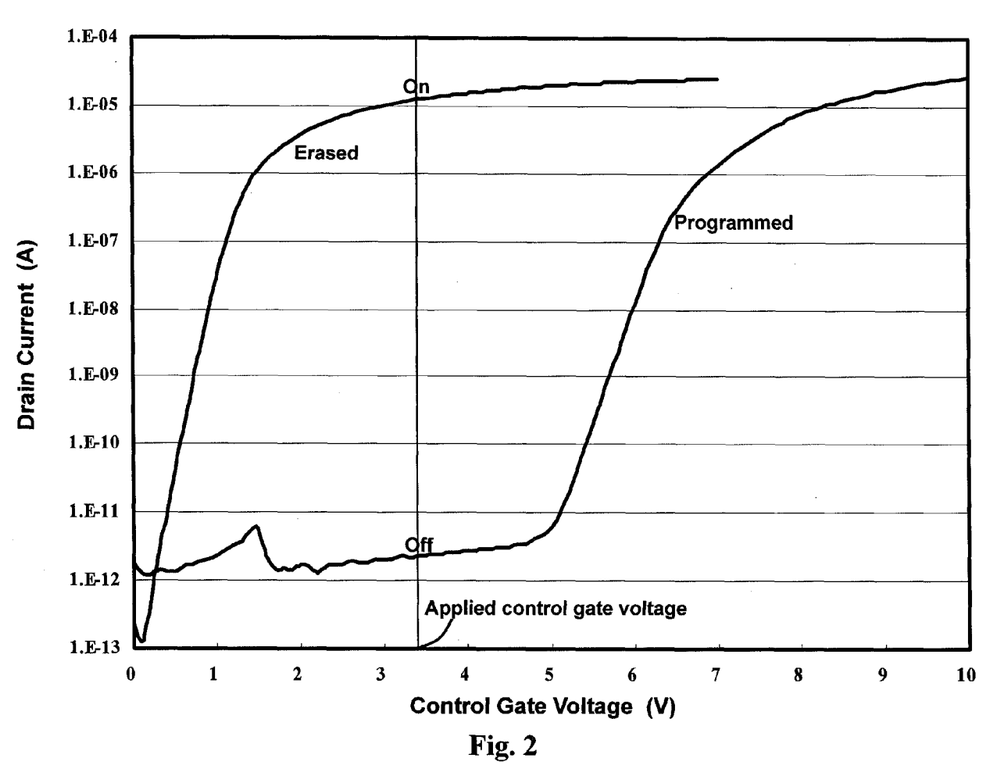
FIG. 2 shows the drain current versus control gate voltage characteristic curves for programmed and erased N-type Scalable Gate Logic Non-volatile Memory (SGLNVM) cells according to one embodiment of the invention.
Figure 3:
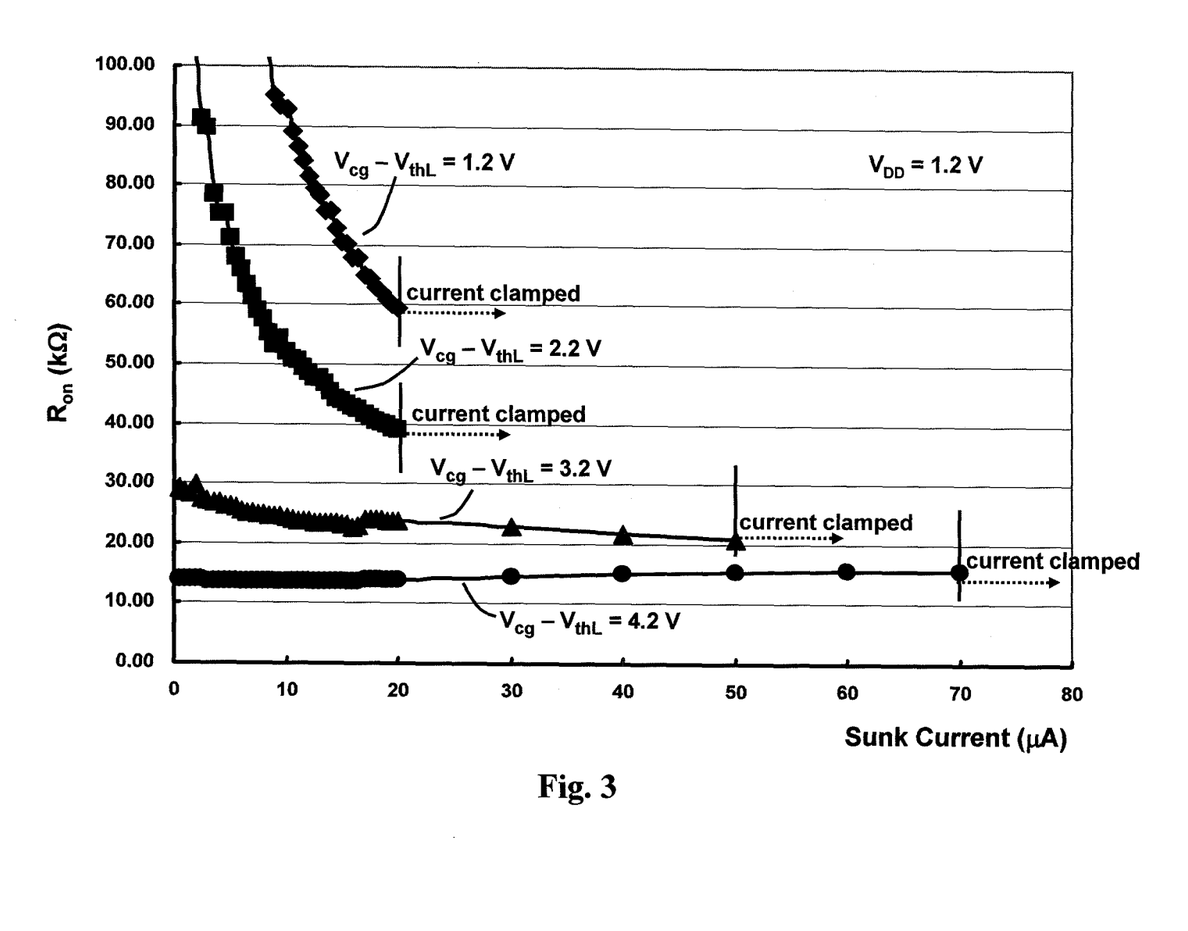
FIG. 3 shows the transistor "on" resistance versus sunk current characteristic curves for an erased N-type SGLNVM according to one embodiment of the invention.

FIG. 2 shows the drain current versus control gate voltage characteristic curves for programmed and erased cells for N-type Scalable Gate Logic Non-Volatile Memory (SGLNVM) devices according to one embodiment of the invention. FIG. 3 shows the $R_{on}$ (transistor "on" resistance) versus sunk current characteristic curves at 1.2 V voltage bias with various applied control gate voltages $V_{cg}$ for an erased N-type SGLNVM device according to one embodiment of the invention. The $R_{on}$ is in the range of tens kΩ in comparison with those of ~MΩ for oxide-breaking anti-fuses (for instance see U.S. Pat. No. 7,825,479 B2). Thus, in term of propagating delay speeds, the quality of interconnection matrix using SGLNVM is better than those using oxide-breaking anti-fuse.

BRIEF DESCRIPTION OF THE DRAWINGS

For a better understanding of the present invention and to show how it may be carried into effect, reference will now be made to the following drawings, which show the preferred embodiment of the present invention, in which.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 4:
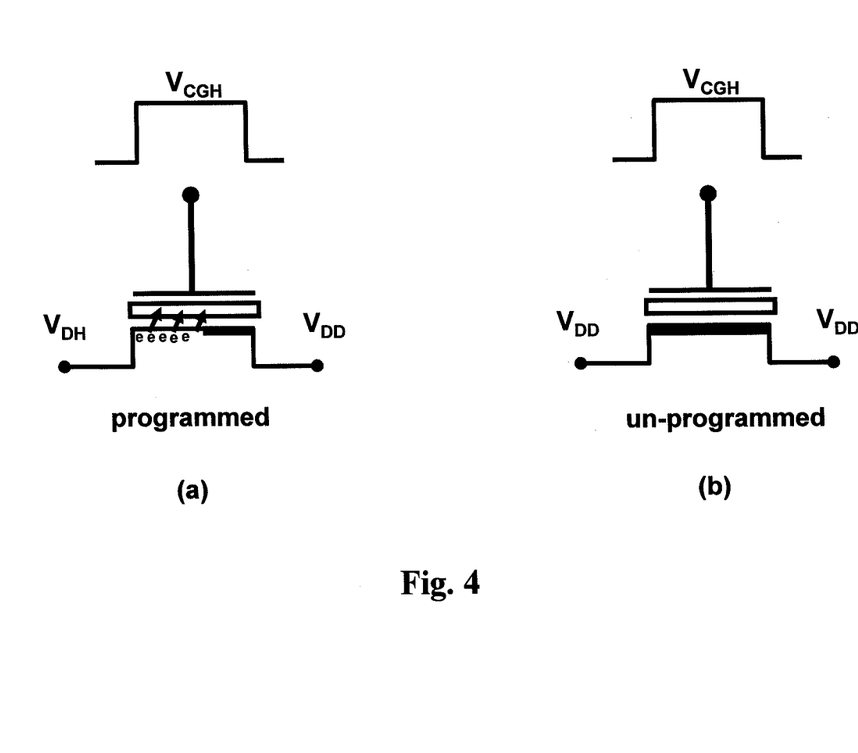
FIG. 4 illustrates programming mechanism for (a) programmed N-type SGLNVM and (b) un-programmed N-type SGLNVM in the programming process according to the invention.

In the preferred embodiment, an M×N N-type SGLNVM array 100 in NOR configuration forms the M×N interconnection matrix as the schematic shown in FIG. 1. The N-type SGLNVM cell array 100 is fabricated by standard CMOS process. The N-type SGLNVM cells 130 in the array are initially erased to a low threshold voltage state by Fowler-Nordheim tunneling or Band-to-Band tunneling. The erase process is done by row-by-row or by the entire array. A row-by-row programming process is done by the programming scheme disclosed in U.S. Pat. No. 7,733,700. In the programming mode, a row of N-type SGLNVM cells denoted by j is selected by passing the core voltage bias $V_{DD}$ to the correspondent source line $O_j$. Thus the source electrodes of the selected row j of the N-type SGLNVM cells are biased at voltage $V_{DD}$. According to an interconnection configuration for the selected row j, the drain electrodes of the selected N-type SGLNVM cells to be programmed are applied with a high voltage bias $V_{DH}$ higher than $V_{DD}$ while the drain electrodes of the selected N-type SGLNVM cells not to be programmed are either biased to $V_{DD}$ or floating from no biasing voltage. When a high voltage pulse with amplitude $V_{CGH}$ higher than $V_{DD}$ is applied for several μs to the control gates of the selected row of N-type SGLNVM cells, the programmed N-type SGLNVM cells with their drain electrodes biased at $V_{DH}$ are programmed to a high threshold voltage state $V_{thH}$ by injecting hot electrons to the floating gate as illustrated in FIG. 4a. Meanwhile the un-programmed SGLNVM cells with one of their two electrodes either biased at $V_{DD}$ or floating equalize the voltage bias $V_{DD}$ between the drain electrode and the attached source line $O_j$ with no hot electrons generated. The hot electrons can not be generated in MOSFET deep linear mode resulting from the high applied gate voltage $V_{CGH}$ to the control gates of non-volatile memory devices leading to the equalized source/drain voltage potential $V_{DD}$ as illustrated in FIG. 4b. Thus, the selected row of the un-programmed SGLNVM cells after applying the high gate voltage pulse remain at the same low threshold voltage state $V_{thL}$ (erased threshold voltages). This entire programming process is similar to the fuse-blown operation in a conventional interconnection matrix having fuse-type elements. The programmed non-volatile memory cells in the interconnection matrix of the invention are similar to those blown fuses to disconnect two connecting nodes. In contrast, the NVM devices in the interconnection matrix of the invention are MTP elements while the fuse-type elements in the conventional interconnection matrix are OTP elements. The NVM interconnection matrix of the invention can be configured and re-configured multiple times.

After programming the M×N NOR array row by row for a specific interconnection configuration, the interconnection matrix is activated by applying a control gate voltage $V_a$ to the control gates of the entire NVM cell array, where $(V_{thL}+V_{DD}) < V_a < V_{thH}$. The selection switches (110, 112, 114, and 116) in FIG. 1 are applied for detaching and attaching the interconnection matrix to external bus lines. For detaching a single Oj line from the M-bus lines, the row of control gates CGj may be applied with a ground voltage lower than the erased NVM threshold voltages to turn off the entire row of NVM devices.

Figure 5:
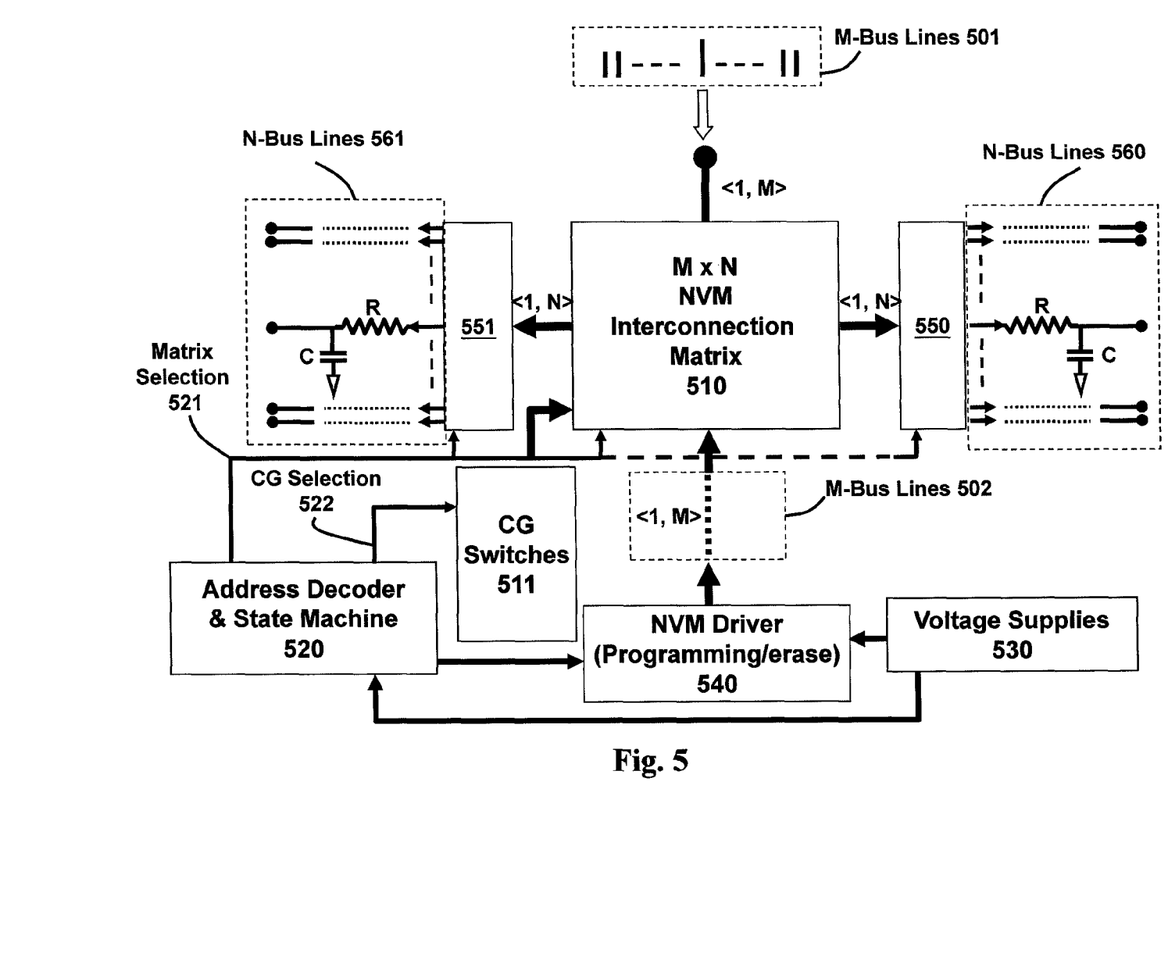
FIG. 5 shows the systematic diagrams of the interconnection matrix using N-type SGLNVM according to one embodiment of the invention.

FIG. 5 shows the systematic view of operating the interconnection matrix 510 according to one embodiment of the invention. A bunch of M-bus lines 501 are connected to the M upper input terminals 101 of the interconnection matrix 510. The M lower input terminals 102 are connected with the M-bus lines 502 attached to the program/erase driver circuitry 540 for configuration operations. The 2N right output terminals 141 and the 2N left output terminals 142 of the interconnection matrix 510 are respectively connected to the data buffer circuit blocks 550 and 551. The data buffers 550 and 551 are designed to drive the line RC loading of the 2N-output bus lines in N-bus lines 560 and 561 to achieve optimized signal propagation delays, respectively. The address decoder and state machine circuit block 520 is applied to select the SGLNVM array 510 and the row of control gates of SGLNVM cells through the control gate line switches 511, and to provide the timing control sequence for matrix configuration and matrix activation operations, respectively. The voltage supply circuit block 530 provides the various voltage biases required for erase and programming operations for the N-type SGNVM array, and the voltage bias for selection switches (110, 112, 114, and 116) as well.

Figure 6:
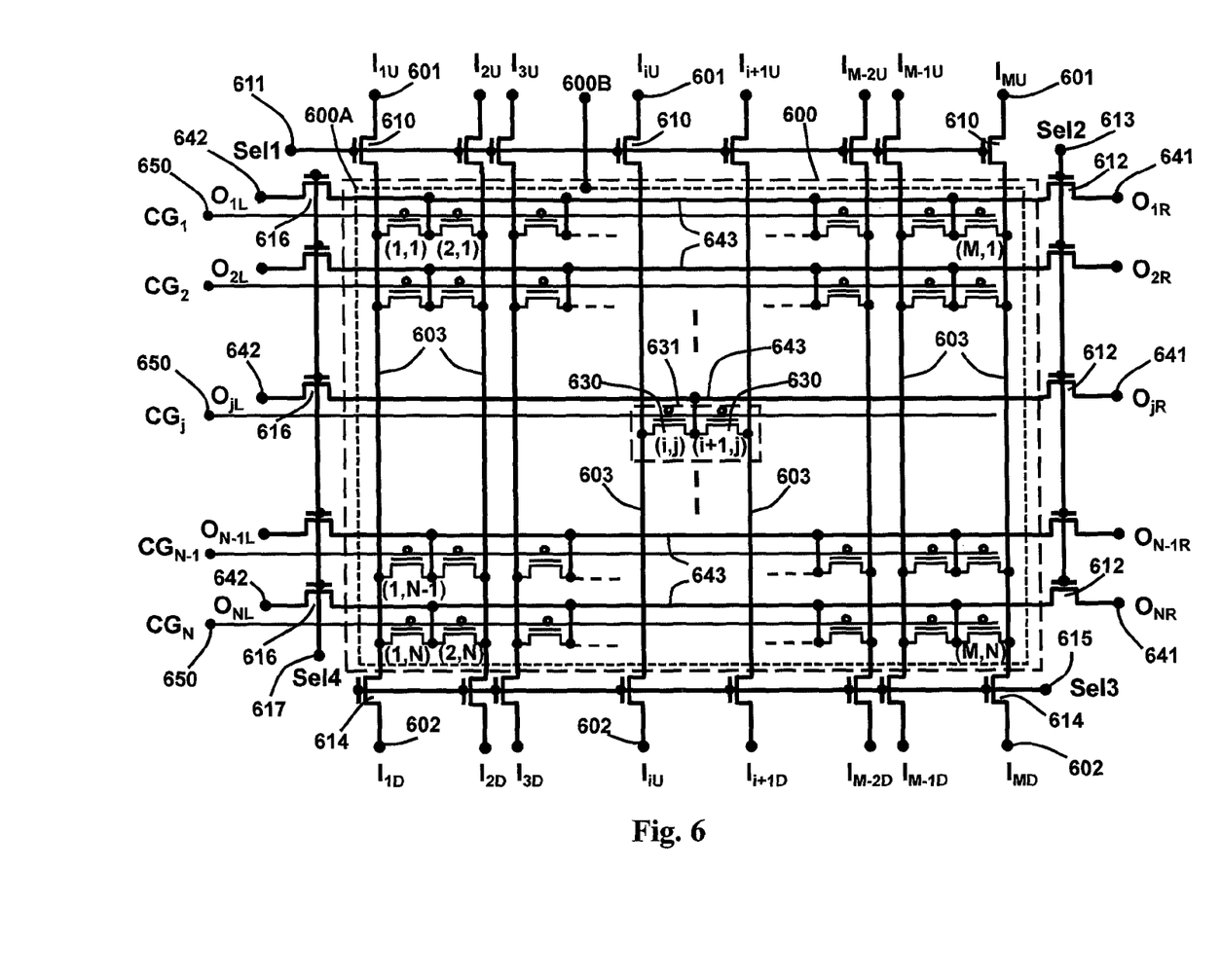
FIG. 6 shows the schematics of the interconnection matrix using P-type non-volatile memory devices according to another embodiment of the invention.

In another embodiment, an M×N P-type NVM array 600 in NOR configuration embedded in a large N-type well 600A with electrode 600B and N-type MOSFET switches (610, 612, 614, and 616) forms the M×N interconnection matrix as the schematic shown in FIG. 6. In the M×N NVM array 600 in the NOR configuration, where the P-type NVM cells 630 are paired with one shared common source electrode and two separate drain electrodes as illustrated in unit 631 in the middle of FIG. 6, a row of control gates 650 of P-type NVM cells 630 forms the control gate line CGj for j=1 ... N; a column of drain electrodes of P-type NVM cells 630 are connected to form the i-bitline 103 for i=1 ... M; a row of common source electrodes of P-type NVM cells 630 are connected to form the j-common source line 643 for j=1 ... N. The input terminals 601 and 602, denoted by $I_{iU}$ and $I_{iD}$ for i=1 ... M, are connected to M bitlines 603 in the M×N NOR P-type NVM array through MOSFET switches 610 and 614, respectively. The output terminals 641 and 642 denoted by $O_{jR}$ and $O_{jL}$ for j=1 ... N are connected to N common source lines 643 in the M×N NOR P-type NVM array through MOSFET switches 612 and 616, respectively.

For configuring interconnection matrix, the P-type NVM cells in the array are initially erased to a low threshold voltage state $W_{thL}$ (toward more negative side) by Fowler-Nordheim tunneling, where the low threshold voltage requires a more negative applied control gate voltage $V_{cg}$ relative to the source electrode voltage $V_s$ to turn on the P-type SGLNVM, that is, $(V_{cg}-V_s-V_{thL})<0$ to turn on the P-type SGLNVM. The stored charges on the floating gate of the P-type SGLNVM at the low threshold voltage state $V_{thL}$ are either holes (positive) or zero charges. The P-type NVM cells with initial low threshold voltages in the array are "off" by applying the same voltage bias to the control gates 650 and well electrode 6009B of the N-type array well. The P-type NVM cells in the array are initially disconnected between nodes in the interconnection matrix before configuration.

To program the P-type NVM in the selected row j, the well electrode 600B and the selected source line Oj are biased with the same high voltage $V_H$ and the correspondent bitlines for the selected NVM cells for programming in the row j are biased with ground voltage for several µs such that a Band-to-Band facilitated hot electrons are injected to the floating gate of the P-type NVM from the well voltage bias $V_H$ to the grounded drain electrodes. For the correspondent bitlines for the un-selected NVM cells in the row j are set to be floating or biased with $V_H$ during ground voltage pulse. The horizontal source lines $O_j$ for the un-selected row are floating during the applied programming ground voltage pulse for not disturbing the un-selected NVM cells in other rows. The programmed P-type NVM cells in row j are thus at their high threshold voltage state $V_{thH}$ such that a higher control gate voltage is required to turn off the programmed P-type NVM cells. Thus after programming, the programmed NVM cells with stored electrons on the floating gate are always "on" to pass the low voltage signal $V_{ss}$, while the un-programmed cells remain "off", when the N-type well and the control gates are biased with the positive voltage bias $V_{DD}$.

After programming the M×N P-type NOR array row by row for a specific interconnection configuration, the interconnection matrix is activated by applying the positive voltage bias $V_{DD}$ to the N-type well 600A and the control gate lines of the entire NVM cell array. The selection switches (610, 612, 614, and 616) in FIG. 6 are applied for detaching and attaching the interconnection matrix to external bus lines (not shown). For detaching a single source line Oj from the M-bus lines, the row of control gates CGj may be applied with a high voltage $V_a > V_{DD}$ such that the applied high voltage $V_a$ is able to turn off the programmed P-type NVM cells. The entire configuring process for the P-type NVM cell array of the invention is similar to the fuse-connecting operation in a conventional interconnection matrix having antifuse-type elements. The programmed P-type non-volatile memory cells in the interconnection matrix of the invention are similar to the connection fuses to connect between nodes. In contrast, the P-type NVM devices in the interconnection matrix of the invention are MTP elements while the anti-fuse elements in the conventional interconnection matrix are OTP elements. The NVM interconnection matrix of the invention can be configured and re-configured multiple times.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of non-volatile memory elements including the types of non-volatile memory device made of different non-volatile material and the types of MOSFET selection switches will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A multiple-time programmable interconnection matrix, comprising:
    a plurality of non-volatile memory (NVM) cells organized in rows and columns, each NVM cell having a source, a drain, a floating gate, a control gate and a channel region, the control gates of the NVM cells in a row forming a corresponding control gate line, the drains of the NVM cells in a column forming a corresponding bit line, the NVM cells in a row being arranged in cell pairs, such that each of the cell pairs share a common source and are connected to two adjacent bit lines, the common sources of the NVM cells in a row forming a corresponding source line, the NVM cells being configured into a plurality of erased cells and a plurality of programmed cells after each programming cycle;
    a plurality of first switches and second switches respectively disposed at first terminals and second terminals of the bit lines; and
    a plurality of third switches and fourth switches respectively disposed at first terminals and second terminals of the source lines;
    wherein conductivity states of the erased cells and the programmed cells depend on a conductivity type of the NVM cells when the control gate lines are biased.

2. The multiple-time programmable interconnection matrix according to claim 1, wherein the first switches are configured to connect the bit lines to a plurality of first external bus lines in response to a first control signal, wherein the second switches are configured to connect the bit lines to a plurality of second external bus lines in response to a second control signal, wherein the third switches are configured to connect the source lines to a plurality of third external bus lines in response to a third control signal, and wherein the fourth switches are configured to connect the source lines to a plurality of fourth external bus lines in response to a fourth control signal.

3. The multiple-time programmable interconnection matrix according to claim 2, wherein the first switches, the second switches, the third switches and the fourth switches are metal-oxide-semiconductor field-effect transistors (MOSFETs).

4. The multiple-time programmable interconnection matrix according to claim 1, wherein the erased cells with a first threshold voltage are turned on and the programmed cells with a second threshold voltage are turned off when the NVM cells are N-type and each control gate line is biased with a first gate voltage greater than the first threshold voltage and less than the second threshold voltage.

5. The multiple-time programmable interconnection matrix according to claim 4, wherein a selected source line is detached from all the bit lines when a second gate voltage is applied to its corresponding control gate line, and wherein the second gate voltage is lower than the first threshold voltage.

6. The multiple-time programmable interconnection matrix according to claim 4, wherein a selected source line is disconnected from a selected bit line when a corresponding NVM cell is in a programmed state.

7. The multiple-time programmable interconnection matrix according to claim 1, wherein the erased cells are turned off and the programmed cells are turned on when the NVM cells are P-type and all the control gate lines and a well electrode are biased with an operating voltage.

8. The multiple-time programmable interconnection matrix according to claim 7, wherein a selected source line is detached from the bit lines when a gate voltage greater than the operating voltage is applied to its corresponding control gate line.

9. The multiple-time programmable interconnection matrix according to claim 7, wherein a selected source line is connected to a selected bit line when a corresponding NVM cell is in a programmed state.

10. A method of configuring a multiple-time programmable interconnection matrix, the multiple-time programmable interconnection matrix comprising a plurality of non-volatile memory (NVM) cells organized in rows and columns, a plurality of first switches, a plurality of second switches, a plurality of third switches and a plurality of fourth switches, each NVM cell having a source, a drain, a floating gate, a control gate and a channel region, the control gates of the NVM cells in a row forming a corresponding control gate line, the drains of the NVM cells in a column forming a corresponding bit line, the NVM cells in a row being arranged in cell pairs, such that each of the cell pairs share a common source and are connected to two adjacent bit lines, the common sources of the NVM cells in a row forming a corresponding source line, the first switches and the second switches being respectively disposed at first terminals and second terminals of the bit lines, the third switches and the fourth switches being respectively disposed at first terminals and second terminals of the source lines, the method comprising:
    changing threshold voltages of the NVM cells to an erased state with a first threshold voltage;
    maintaining a plurality of first NVM cells of a row in the erased state with the first threshold voltage for a programming interval by applying an operating voltage to their corresponding bit lines or floating the corresponding bit lines;
    programming a plurality of second NVM cells in the row to a programmed state with a second threshold voltage by applying the operating voltage to a corresponding source line, a first high voltage to their corresponding bit lines and a second high voltage to a corresponding control gate line for the programming interval; and
    repeating the steps of programming and maintaining on a row by row basis until all the NVM cells are processed;
    wherein the first high voltage and the second high voltage are greater than the operating voltage; and
    wherein the NVM cells are N-type and the first threshold voltage is less than the second threshold voltage.

11. The method according to claim 10, further comprising:
    connecting the bit lines to a plurality of first external bus lines by turning on the first switches in response to a first control signal after the step of repeating;
    connecting the bit lines to a plurality of second external bus lines by turning on the second switches in response to a second control signal after the step of repeating;

connecting the source lines to a plurality of third external bus lines by turning on the third switches in response to a third control signal after the step of repeating; and connecting the source lines to a plurality of fourth external bus lines by turning on the fourth switches in response to a fourth control signal after the step of repeating.

12. The method according to claim 10, further comprising:
connecting the source lines to the bit lines by applying a gate voltage greater than the first threshold voltage to all the control gate lines after the step of changing and before the steps of programming and maintaining.

13. The method according to claim 10, further comprising:
turning off the second NVM cells with the second threshold voltage and turning on the first NVM cells with the first threshold voltage by applying a gate voltage to all the control gate lines after the step of repeating;
wherein the gate voltage is greater than the first threshold voltage and less than the second threshold voltage.

14. The method according to claim 13, wherein $(V_{thL}+V_{DD}) < V_a < V_{thH}$, and wherein $V_{thL}$ denotes the first threshold voltage, $V_{thH}$ denotes the second threshold voltage, $V_{DD}$ denotes the operating voltage and $V_a$ denotes the gate voltage.

15. The method according to claim 13, which operates like a fuse-blown operation in a conventional interconnection matrix having fuse-type elements.

16. The method according to claim 10, further comprising:
detaching a selected source line from the bit lines by applying a gate voltage to a corresponding control gate line to turn off corresponding NVM cells after the step of repeating;
wherein the gate voltage is lower than the first threshold voltage.

17. A method of configuring a multiple-time programmable interconnection matrix, the multiple-time programmable interconnection matrix comprising a plurality of non-volatile memory (NVM) cells organized in rows and columns, a plurality of first switches, a plurality of second switches, a plurality of third switches and a plurality of fourth switches, each NVM cell having a source, a drain, a floating gate, a control gate and a channel region, the control gates of the NVM cells in a row forming a corresponding control gate line, the drains of the NVM cells in a column forming a corresponding bit line, the NVM cells in a row being arranged in cell pairs, such that each of the cell pairs share a common source and are connected to two adjacent bit lines, the common sources of the NVM cells in a row forming a corresponding source line, the first switches and the second switches being respectively disposed at first terminals and second terminals of the bit lines, the third switches and the fourth switches being respectively disposed at first terminals and second terminals of the source lines, the method comprising:
changing threshold voltages of the NVM cells to an erased state with a first threshold voltage;
maintaining a plurality of first NVM cells of a row in the erased state with the first threshold voltage for a programming interval by floating their corresponding bit lines or applying a first high voltage to their corresponding bit lines;
programming a plurality of second NVM cells in the row to a programmed state with a second threshold voltage by applying the first high voltage to both a well electrode and a corresponding source line and a ground voltage to their corresponding bit lines for the programming interval; and
repeating the steps of programming and maintaining on a row by row basis until all the NVM cells are processed;
wherein the NVM cells are P-type and the first threshold voltage is less than the second threshold voltage.

18. The method according to claim 17, further comprising:
connecting the bit lines to a plurality of first external bus lines by turning on the first switches in response to a first control signal after the step of repeating;
connecting the bit lines to a plurality of second external bus lines by turning on the second switches in response to a second control signal after the step of repeating;
connecting the source lines to a plurality of third external bus lines by turning on the third switches in response to a third control signal after the step of repeating; and
connecting the source lines to a plurality of fourth external bus lines by turning on the fourth switches in response to a fourth control signal after the step of repeating.

19. The method according to claim 17, further comprising:
disconnecting all the source lines from all the bit lines by applying a same voltage to the well electrode and all the control gate lines after the step of changing and before the steps of programming and maintaining.

20. The method according to claim 17, further comprising:
turning off the first NVM cells with the first threshold voltage and turning on the second NVM cells with the second threshold voltage by applying an operating voltage to the well electrode and all the control gate lines after the step of repeating.

21. The method according to claim 20, which operates like a fuse-connecting operation in a conventional interconnection matrix having antifuse-type elements.

22. The method according to claim 17, further comprising:
detaching a selected source line from the bit lines by applying a second high voltage to a corresponding control gate line to turn off corresponding NVM cells after the step of repeating;
wherein the second high voltage is greater than an operating voltage.

23. The method according to claim 17, further comprising:
maintaining a plurality of third NVM cells of the other rows in their states by floating their corresponding source lines for the programming interval.

* * * * *